(12) United States Patent
Louh

(10) Patent No.: US 7,794,646 B2
(45) Date of Patent: Sep. 14, 2010

(54) METHOD FOR MANUFACTURING MOLD USED IN IMPRESSION PROCESS

(75) Inventor: Sei-Ping Louh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 12/261,287

(22) Filed: Oct. 30, 2008

(65) Prior Publication Data

US 2009/0174099 A1   Jul. 9, 2009

(30) Foreign Application Priority Data

Jan. 3, 2008   (CN) .................. 2008 1 0300007

(51) Int. Cl.
*B29C 35/08*   (2006.01)
*B29D 11/00*   (2006.01)
*B29C 33/40*   (2006.01)

(52) U.S. Cl. .................. 264/496; 264/2.5; 264/219

(58) Field of Classification Search .................. 264/219, 264/2.5, 496
See application file for complete search history.

(56) References Cited

U.S. PATENT DOCUMENTS

| | | | | |
|---|---|---|---|---|
| 5,251,202 A | * | 10/1993 | Kaneko et al. | 369/286 |
| 5,368,908 A | * | 11/1994 | Ohta et al. | 428/64.4 |
| 6,991,890 B2 | * | 1/2006 | Li et al. | 430/270.1 |
| 7,273,820 B2 | * | 9/2007 | Nakagawa et al. | 438/778 |
| 2005/0008286 A1 | * | 1/2005 | Ahn et al. | 385/24 |

* cited by examiner

*Primary Examiner*—Kat Wyrozebski
*Assistant Examiner*—Robert J Grun
(74) *Attorney, Agent, or Firm*—Andrew C. Cheng

(57) ABSTRACT

A method for manufacturing a mold used in impression process is provided. The method includes the following steps: forming a negative photoresist layer between a transparent substrate and a supporting substrate; exposing the negative photoresist layer via the transparent substrate by direct writing technology; removing the supporting substrate; and developing the negative photoresist layer to form the mold.

19 Claims, 4 Drawing Sheets

METHOD FOR MANUFACTURING MOLD USED IN IMPRESSION PROCESS

BACKGROUND

1. Field of the Invention

Embodiments of the present disclosure relate to molds and, particularly, to a method for manufacturing a mold used in impression process.

2. Description of Related Art

Transparent elements, especially aspheric glass lenses, are widely used in digital cameras, video recorders, compact disc players and other optical systems due to their excellent optical properties. At present, an impression process using ultraviolet radiation is commonly employed for manufacturing of the transparent elements. Typically, a polymer is impressed using a mold and irradiated via ultraviolet radiation to form products. In the impression process, a mold is generally used for molding the transparent elements.

However, a common method for manufacturing a mold used in the impression process includes a number of complex steps, such as etching and electroforming. Therefore, the method is unduly time-consuming and costly.

Therefore, it is desirable to provide a method for manufacturing a mold, which can overcome the above mentioned problems.

DETAILED DESCRIPTION

Figure 1:
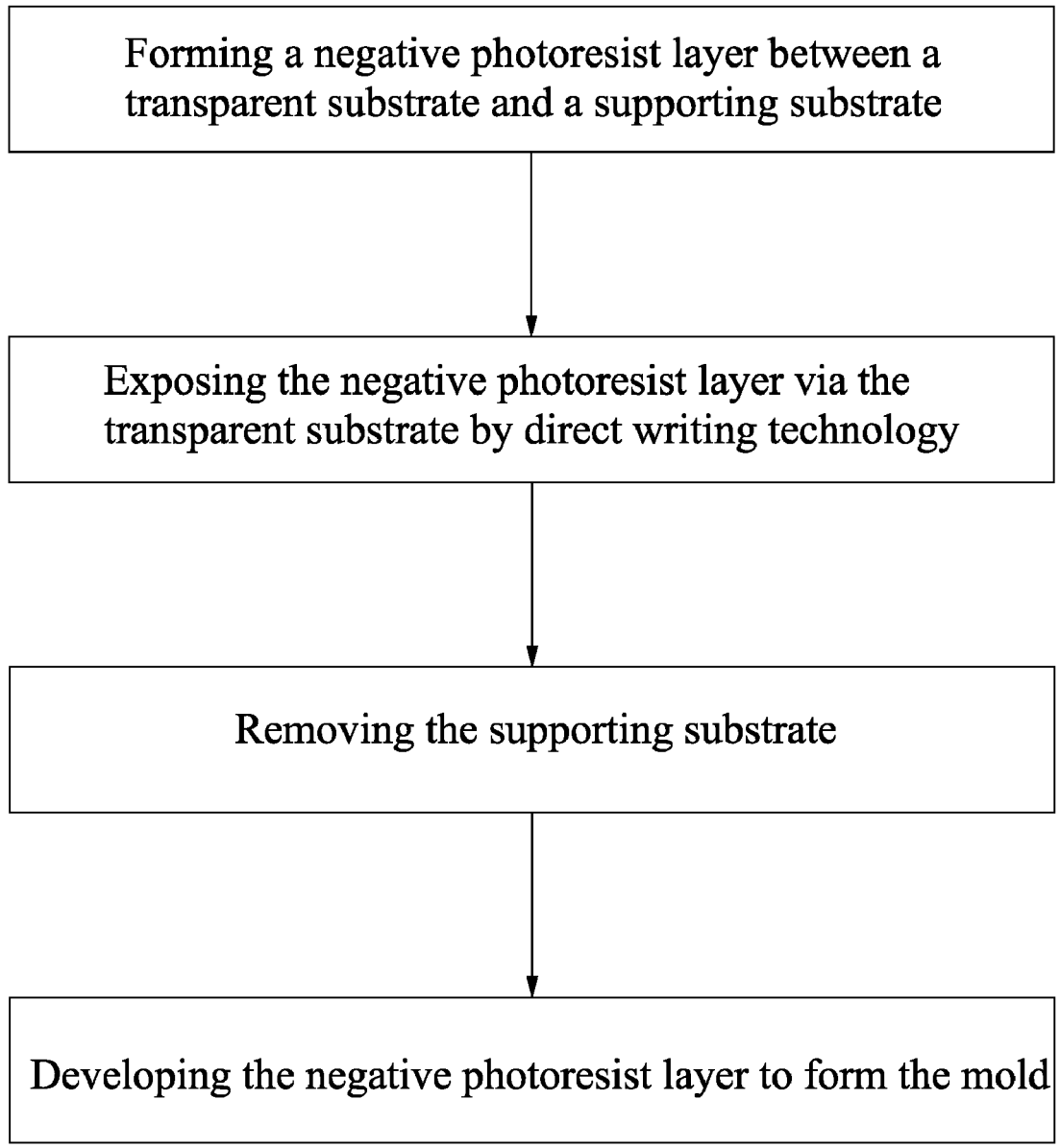
FIG. 1 is a flowchart of one embodiment of a method for manufacturing a mold.

FIG. 1 is a flowchart of one embodiment of a method for manufacturing a mold 100 (see FIG. 4) used in the impression process. The method includes the following steps: forming a negative photoresist layer between a transparent substrate and a supporting substrate; exposing the negative photoresist layer through the transparent substrate by direct writing technology; removing the supporting substrate; and developing the negative photoresist layer to form the mold.

Figure 2:
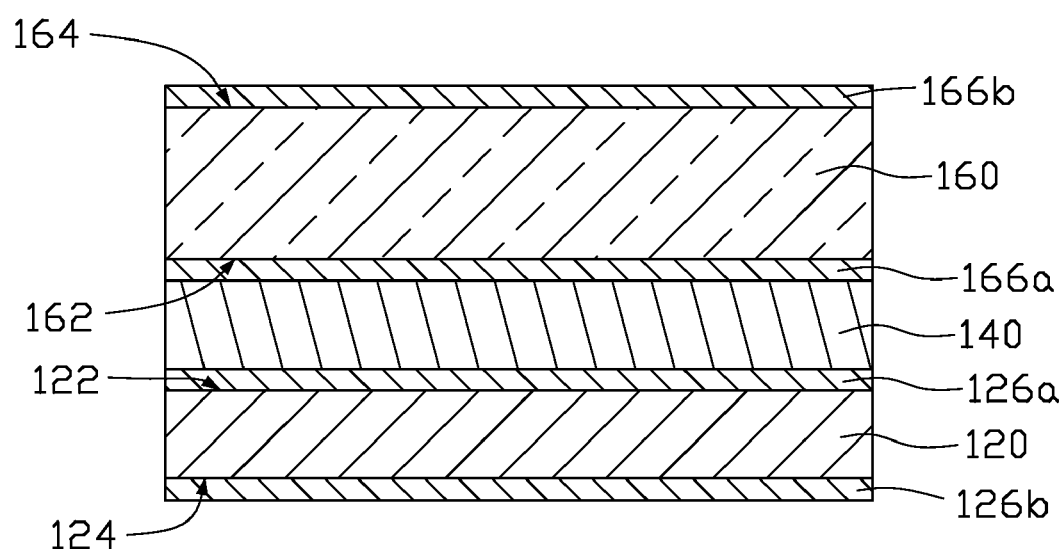
FIG. 2 show a schematic view of a negative photoresist layer formed between a transparent substrate and a supporting substrate in a stage of performing the method shown in FIG. 1.

Referring to FIG. 2, a supporting substrate 120 is provided. The supporting substrate 120 can be a glass, plastic, iron or copper substrate. The supporting substrate 120 has a first surface 122 and a second surface 124. An antireflection layer may be formed on the first surface 122 and/or the second surface 124, to keep the light beam crossed the supporting substrate 120 from reflecting. In this embodiment, first and second antireflection layers 126a, 126b are respectively formed on the first and second surfaces 122, 124.

The material of the first antireflection layer 126a can be the same as that of the second antireflection layer 126b. The first and second antireflection layers 126a, 126b are made of a material having high index of refraction, such as tantalum oxide or titanium oxide. Understandably, the first and second antireflection layers 126a, 126b can be made from two alternately superposed materials, a material having high index of refraction and a material having low index of refraction, such as silicon dioxide and aluminum dioxide.

The first and second antireflection layers 126a, 126b can be formed on the first and second surfaces 122, 124 by physical gas deposition i.e. hot evaporating, electrical slurry sputtering, ion beam sputtering, chemical gas deposition, or film deposition. The thickness of the first and second antireflection layers 126a, 126b may vary according to the need of users.

In this embodiment, a negative photoresist layer 140 is formed on the first antireflection layer 126a of the supporting substrate 120. The negative photoresist layer 140 can be formed by spraying or spin coating. The thickness of the negative photoresist layer 140 is determined according to the need of users. Upon the condition that the first antireflection layer 126a is omitted, the negative photoresist layer 140 may form directly on the first surface 122 of the supporting substrate 120.

A transparent substrate 160, such as a glass substrate is provided. The transparent substrate 160 is formed on the negative photoresist layer 140. The transparent substrate 160 has a third surface 162 and a fourth surface 164. An antireflection layer may be formed on the third surface 162 and/or the fourth surface 164, to keep the light beam crossed the transparent substrate 160 from reflecting. In this embodiment, a third and fourth antireflection layers 166a, 166b are respectively formed on the third and fourth surfaces 162, 164.

The material of the third antireflection layer 166a can be the same as that of the fourth antireflection layer 166b. The third and fourth antireflection layers 166a, 166b are made of a material having high index of refraction, such as tantalum oxide or titanium oxide. Understandably, the third and fourth antireflection layers 166a, 166b can be made from two alternately superposed materials, a material having high index of refraction and a material having low index of refraction, such as silicon dioxide and aluminum dioxide.

The third and fourth antireflection layers 166a, 166b can be formed on the third and fourth surfaces 162, 164 by physical gas deposition i.e. hot evaporated, electrical slurry sputtering, ion beam sputtering, chemical gas deposition, or film deposition. The thickness of the third and fourth antireflection layers 166a, 166b may vary according to the need of users.

In this embodiment, the negative photoresist layer 140 is positioned between the first antireflection layers 126a of the supporting substrate 120 and the third antireflection layer 166a of the transparent substrate 160. Upon the condition that the first and third antireflection layers 126a, 166a are omitted, the negative photoresist layer 140 may form and directly contacts the first surface 122 of the supporting substrate 120 and the third surface 162 of the transparent substrate 160.

Figure 3:
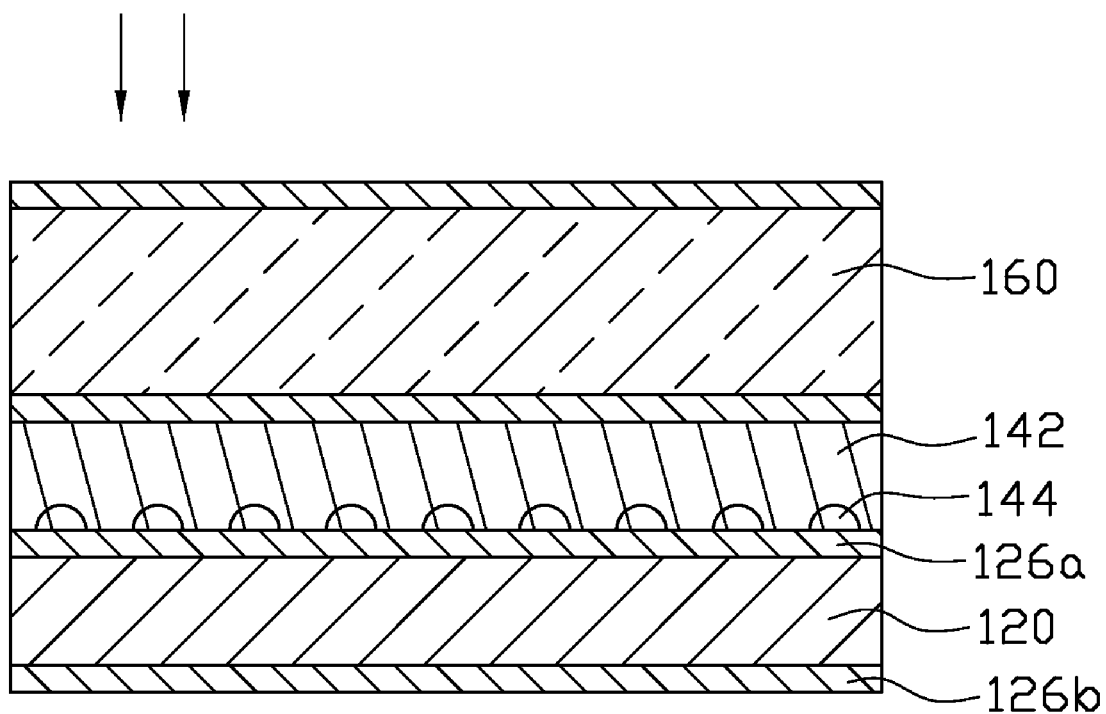
FIG. 3 is similar to the FIG. 2, but showing a schematic view of exposing the negative photoresist layer in a subsequent stage of performing the method shown in FIG. 1.

Referring to FIG. 3, the negative photoresist layer 140 can be exposed via the transparent substrate 160 by direct writing technology, such as laser direct writing technology or electron beam direct writing technology to form a predetermined pattern. In this embodiment, a laser is used to expose the negative photoresist layer 140. In the process of the exposing, a laser faces the transparent substrate 160 and emits a laser beam to write the predetermined pattern in the negative photoresist layer 140.

In this embodiment, after exposure to the laser, an exposing portion 142 and a number of non-exposing portions 144 are formed in the negative photoresist layer 140. The first and second antireflection layers 126a, 126b can protect the non-exposing portions 144 from exposing via keeping the light beam crossed the supporting substrate 120 from reflecting. The structure of the non-exposing portions 144 can be designed according to need of users, such as column, V-shaped groove, triangle wimble.

Figure 4:
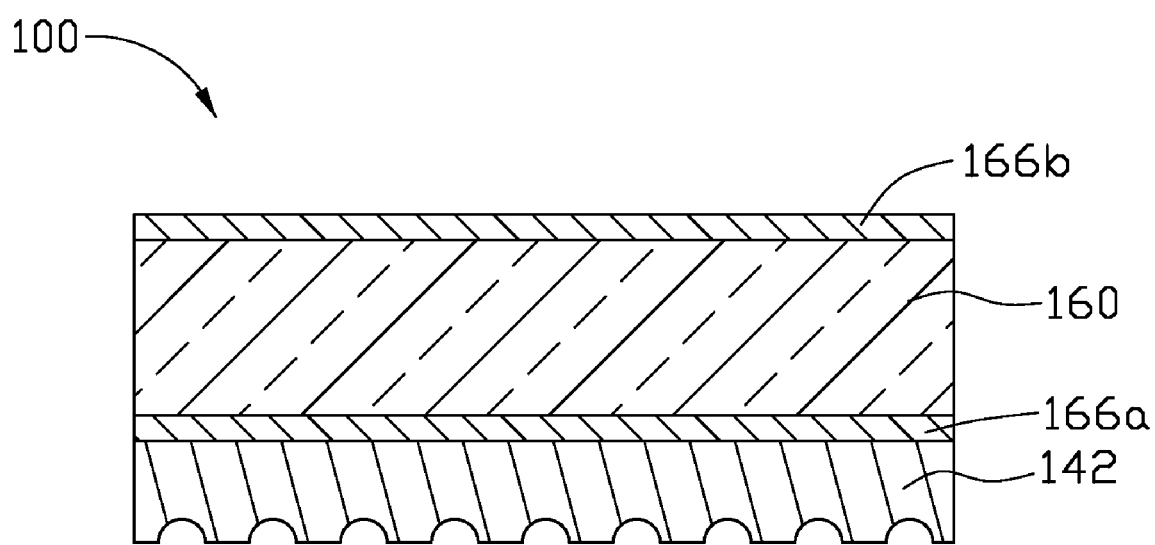
FIG. 4 is similar to the FIG. 3, but showing a schematic view of the mold in a subsequent stage of performing the method shown in FIG. 1.

Referring to FIG. 4, the supporting substrate 120 is removed and the non-exposing portion 144 is developed to form the mold 100. The non-exposing portions 144 are dissolved in a developing liquid. Advantageously, the transparent substrate 160 with the negative photoresist layer 140 can be baked after exposing, so the non-exposing portion 144 is prone to dissolve. The method of baking includes hot-air convection, infrared-ray radiancy or hot-plate conduction. In this embodiment, the transparent substrate 160 is baked by hot-plate conduction. The temperature of the baking is approximately in the range from 70 to 100 centigrade degrees. The time of the baking is approximately in the range from 4 to 8 minutes.

Advantageously, the transparent substrate 160 is required to be baked extensively, so the exposing portion 142 is prone to adhere to the transparent substrate 160. The temperature of the extensive baking is approximately in the range from 185 to 200 centigrade degrees, and the time is approximately in the range from 15 to 20 minutes.

The above mentioned method for manufacturing the mold used in the impression process is simple, time-saving and cost-saving. The structure of the mold can be designed by direct writing technology, thus the method for manufacturing the mold is convenient for users.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A method for manufacturing a mold used in impression process, comprising:
    providing a transparent substrate and a supporting substrate, the supporting substrate comprising a first antireflection layer, the supporting substrate having a first surface, the first antireflection layer being formed on the first surface;
    forming a negative photoresist layer between the transparent substrate and the first antireflection layer of the supporting substrate;
    exposing the negative photoresist layer through the transparent substrate by direct writing technology;
    removing the supporting substrate; and
    developing the negative photoresist layer to form the mold.

2. The method of claim 1, wherein the transparent substrate is made of glass.

3. The method of claim 1, wherein the supporting substrate is made of a material selected from the group consisting of glass, plastic, iron and copper.

4. The method of claim 1, wherein the first antireflection layer is made of a material having high index of refraction, the material having high index of refraction is selected from the group consisting of tantalum oxide and titanium oxide.

5. The method of claim 1, wherein the first antireflection layer is made of a material having high index of refraction and a material having low index of refraction alternately superposed, the material having high index of refraction is selected from the group consisting of tantalum oxide and titanium oxide, the material having low index of refraction is selected from the group consisting of silicon dioxide and aluminum dioxide.

6. The method of claim 1, wherein the supporting substrate comprises a second antireflection layer, the supporting substrate has a first surface and a second surface, the second antireflection layer is formed on the second surface, the negative photoresist layer is formed between the transparent substrate and the first surface of the supporting substrate.

7. The method of claim 6, wherein the supporting substrate further comprises a first antireflection layer, the first antireflection layer is formed on the first surface.

8. The method of claim 6, wherein the second antireflection layer is made of a material having high index of refraction, the material having high index of refraction is selected from the group consisting of tantalum oxide and titanium oxide.

9. The method of claim 6, wherein the second antireflection layer is made of a material having high index of refraction and a material having low index of refraction alternately superposed, the material having high index of refraction is selected from the group consisting of tantalum oxide and titanium oxide, the material having low index of refraction is selected from the group consisting of silicon dioxide and aluminum dioxide.

10. The method of claim 1, wherein the transparent substrate comprises a third antireflection layer, the transparent substrate has a third surface, the third antireflection layer is formed on the third surface, the negative photoresist layer is formed between the third antireflection layer of the transparent substrate and the supporting substrate.

11. The method of claim 10, wherein the third antireflection layer is made of a material having high index of refraction, the material having high index of refraction is selected from the group consisting of tantalum oxide and titanium oxide.

12. The method of claim 10, wherein the third antireflection layer is made of a material having a high index of refraction and a material having a low index of refraction alternately superposed, the material having a high index of refraction is selected from the group consisting of tantalum oxide and titanium oxide, and the material having a low index of refraction is selected from the group consisting of silicon dioxide and aluminum dioxide.

13. The method of claim 1, wherein the transparent substrate comprises a fourth antireflection layer, the transparent substrate has a third surface and a fourth surface, the fourth antireflection layer is formed on the fourth surface, the negative photoresist layer is formed between the third surface of the transparent substrate and the supporting substrate.

14. The method of claim 13, wherein the transparent substrate further comprises a third antireflection layer, the third antireflection layer is formed on the third surface.

15. The method of claim 13, wherein the fourth antireflection layer is made of a material having high index of refraction, the material having high index of refraction is selected from the group consisting of tantalum oxide and titanium oxide.

16. The method of claim 13, wherein the fourth antireflection layer is made of a material having high index of refraction and a material having low index of refraction alternately superposed, the material having high index of refraction is selected from the group consisting of tantalum oxide and titanium oxide, the material having low index of refraction is selected from the group consisting of silicon dioxide and aluminum dioxide.

17. The method of claim 1, wherein the negative photoresist layer is formed by spraying or spin coating.

18. The method of claim 1, further comprising a step of baking the transparent substrate after removing the supporting substrate.

19. The method of claim 1, further comprising a step of baking the transparent substrate after developing the negative photoresist layer.

* * * * *